United States Patent
Hayashi et al.

(10) Patent No.: US 12,153,343 B2
(45) Date of Patent: Nov. 26, 2024

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventors: Tatsuya Hayashi, Tochigi (JP); Takafumi Miyaharu, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/082,178

(22) Filed: Dec. 15, 2022

(65) Prior Publication Data
US 2023/0194981 A1  Jun. 22, 2023

(30) Foreign Application Priority Data

Dec. 20, 2021  (JP) ................................. 2021-206268

(51) Int. Cl.
    *G03F 7/00*  (2006.01)
(52) U.S. Cl.
    CPC ................................. *G03F 7/0002* (2013.01)
(58) Field of Classification Search
    CPC ... G03F 7/0002; H01L 21/0271; Y02A 10/11; B25J 11/008; B25J 19/023
    See application file for complete search history.

(56) References Cited

U.S. PATENT DOCUMENTS

| | | | |
|---|---|---|---|
| 11,181,819 B2 | 11/2021 | Tavakkoli Kermani Ghariehali et al. | |
| 2015/0004275 A1* | 1/2015 | Miyajima | G03F 7/2002 425/385 |
| 2019/0079391 A1* | 3/2019 | Fukuhara | G03F 7/0002 |
| 2019/0221421 A1* | 7/2019 | Fukuhara | G03F 7/0002 |
| 2020/0150529 A1* | 5/2020 | Kobayashi | G03F 7/0002 |
| 2022/0242013 A1* | 8/2022 | Matsuoka | B29C 35/0805 |
| 2023/0213854 A1* | 7/2023 | Murakami | G03F 9/7042 101/450.1 |

FOREIGN PATENT DOCUMENTS

JP  2020198428 A  12/2020

\* cited by examiner

*Primary Examiner* — Deoram Persaud
(74) *Attorney, Agent, or Firm* — ROSSI, KIMMS & McDOWELL LLP (57) ABSTRACT

An imprint method of curing an imprint material in a state in which the imprint material on a substrate and a mold are in contact with each other, includes curing the imprint material by applying first light to the imprint material using a first light source and applying second light to the imprint material using a second light source, thereby forming a plurality of patterns made of a cured product of the imprint material. An intensity distribution of the second light applied to the imprint material by the second light source in the curing is adjusted such that a distribution of evaluation values of the plurality of patterns formed through the curing satisfies a target distribution.

22 Claims, 9 Drawing Sheets

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Description of the Related Art

There is known an imprint method of bringing a mold into contact with an imprint material on a substrate and curing the imprint material by applying light to the imprint material, thereby forming a pattern made of a cured product of the imprint material. Japanese Patent Laid-Open No. 2020-198428 describes that in a method of forming a pattern on a region of a substrate using a template, a formable material is exposed with a spatial distribution of exposure amount in which the inner exposure amount applied to the inside of the region is larger than the side-wall exposure amount entering the mesa side wall of the template.

If the imprint material (formable material) is exposed with a nonuniform exposure amount distribution, the height of the pattern or the line width of the pattern formed through a curing step can become nonuniform. Further, in a semiconductor process, an etching process may be performed after forming a pattern by the imprint method. Exposing the imprint material with a nonuniform exposure amount distribution can result in a nonuniform pattern height or a nonuniform pattern line width after the etching process.

SUMMARY OF THE INVENTION

The present invention provides a technique advantageous in improving uniformity of a plurality of patterns formed on a substrate using an imprint technique.

One of aspects of the present invention provides an imprint method of curing an imprint material in a state in which the imprint material on a substrate and a mold are in contact with each other, the method comprising curing the imprint material by applying first light to the imprint material using a first light source and applying second light to the imprint material using a second light source, thereby forming a plurality of patterns made of a cured product of the imprint material, wherein an intensity distribution of the second light applied to the imprint material by the second light source in the curing is adjusted such that a distribution of evaluation values of the plurality of patterns formed through the curing satisfies a target distribution.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
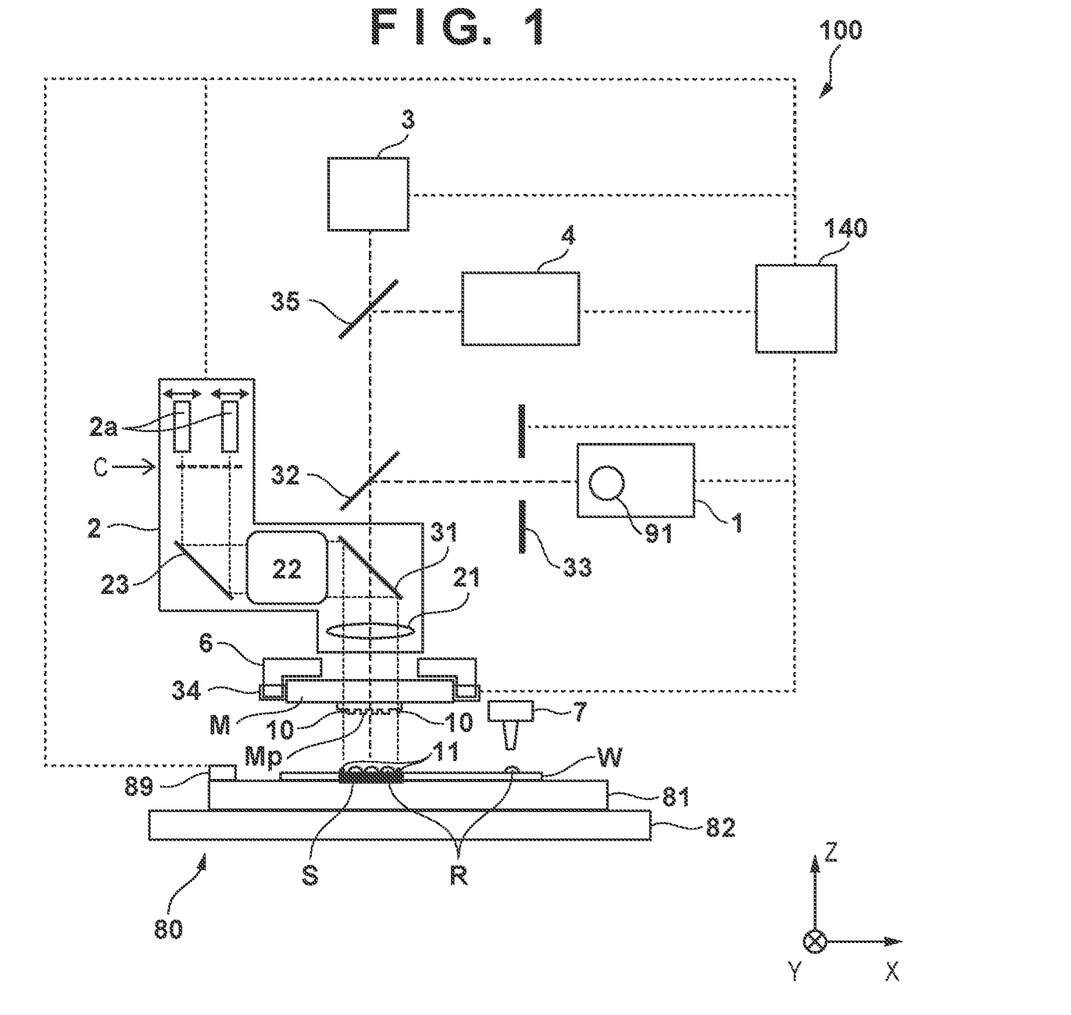
FIG. 1 is a view schematically showing the arrangement of an imprint apparatus according to the first embodiment.

FIG. 1 schematically shows the arrangement of an imprint apparatus 100 according to the first embodiment. The imprint apparatus 100 can be used to manufacture an article such as a semiconductor device. The imprint apparatus 100 cures an imprint material R in a state in which the imprint material R on a substrate W and a mold M are in contact with each other. Thus, a plurality of patterns made of a cured product of the imprint material R can be formed on a substrate W. In this specification and the drawings, directions are described according to an XYZ coordinate system. The substrate W can be arranged parallel to an X-Y plane. The X-Y plane can be a horizontal plane, and the −Z-axis direction can be a vertical direction.

As the imprint material, a curable composition (to be also referred to as a resin in an uncured state) to be cured with light irradiation is used. The wavelength of light can be selected from a range of 10 nm (inclusive) to 1 mm (inclusive). The curable composition contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be supplied as a film onto the substrate by a spin coater or a slit coater. The imprint material can be arranged on the substrate in the form of droplets or in the form of an island or film formed by connecting a plurality of droplets. The viscosity (the viscosity at 25° C.) of the imprint material can be, for example, 1 mPa·s or more to 100 mPa·s or less. As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass. The mold M includes a pattern region Mp corresponding to a shot region S of the substrate W. The pattern region Mp can include a device pattern region including a device pattern to be transferred, and a peripheral region that is located outside the device pattern region and including a mark 10 to be transferred. The mold M is made of quartz or the like that can transmit light.

The imprint apparatus 100 can include, for example, a mold driving mechanism 6, a substrate driving mechanism 80, a first light source unit 1, and a second light source unit 4. In addition to them, the imprint apparatus 100 can include an alignment optical system 2, an observation optical system 3, and a dispenser 7.

The mold driving mechanism 6 can include a mold chuck that holds the mold M by a vacuum suction force, an electrostatic force, or the like, and a mold driving actuator that drives the mold chuck. The mold driving mechanism 6 may include a mold shape correction mechanism 34 that deforms the mold M in the X-axis direction and the Y-axis direction to correct a distortion of the pattern to be transferred to the imprint material R. The mold shape correction mechanism 34 can correct the shape of the pattern region Mp by applying a force to the side surface of the mold M by a correction actuator and deforming the shape of the pattern region Mp into a target shape. The correction actuator can include, for example, a piezoelectric actuator. The correction actuator of the mold shape correction mechanism 34 is controlled by a correction unit 140. For example, the mold shape correction mechanism 34 can adjust a distortion of the pattern region Mp on the order of nanometer or the order of sub-nanometer.

An operation of bringing the imprint material R on the substrate W and the mold M into contact with each other and an operation of separating the cured imprint material R and the mold M from each other may be implemented by moving the mold M in the Z-axis direction, but may be implemented by, for example, moving the substrate W in the Z-axis direction. Alternatively, these operations may be implemented by driving both the mold M and the substrate W.

The substrate driving mechanism 80 can include a substrate stage 81 including a substrate chuck that holds the substrate W by vacuum suction or the like, and a substrate driving actuator 82 that drives the substrate stage 81. The substrate driving actuator 82 can drive the substrate stage 81 concerning the X-axis direction, the Y-axis direction, and a rotation about the Z-axis. Further, the substrate driving actuator 82 may drive the substrate stage 81 concerning at least one of a rotation about the X-axis, a rotation about the Y-axis, and the Z-axis direction.

The first light source unit 1 can be controlled by the control unit 140 so as to irradiate the imprint material R with light such as ultraviolet light to cure the imprint material R after a contact step of bringing the imprint material R on the substrate W and the transfer region of the mold M into contact with each other. For example, the first light source unit 1 can include, as a first light source 91, at least one of a high-pressure mercury lamp, an excimer lamp, an excimer laser, a light emitting diode, or a laser diode.

In an example, the first light source unit 1 can include a high-pressure mercury lamp as the first light source 91. The high-pressure mercury lamp can generate, for example, light having peak intensities at at least two wavelengths. More specifically, the high-pressure mercury lamp can generate light including, for example, a bright line having a wavelength of 313 nm and a bright line having a wavelength of 365 nm. The light intensity (peak intensity) at the wavelength of 313 nm can be equal to the light intensity (peak intensity) at the wavelength of 365 nm. The imprint material R is desirably formed to absorb both the light having the wavelength of 313 nm and the light having the wavelength of 365 nm and undergo a curing reaction. In this case, the illuminance that contributes to the curing reaction is about twice that in a case of one wavelength. This can shorten the time required to cure the imprint material R, and largely improve the throughput of the imprint apparatus 100. In optical design, a lens group designed for multiple wavelengths is generally inferior in aberration performance to a lens group designed for a single wavelength. However, for the imprint apparatus 100, the role of exposure light is to cure the imprint material R. Therefore, a decrease in pattern transfer performance due to the increase in aberration is small. The first light source unit 1 can include a plurality of optical elements in addition to the first light source 91. The plurality of optical elements can define the illuminance distribution of the pattern region of the mold M.

A light shielding unit 33 can be provided to define the light irradiation region with respect to the substrate W by the first light source unit 1. The light shielding unit 33 may be understood as a component of the first light source unit 1, or may be understood as a component different from the first light source unit 1. The light shielding unit 33 can include a light shielding member that defines an opening through which light from the first light source 91 of the light source unit 1 passes, and an actuator that drives the light shielding member. The irradiation region by the first light source unit 1 defined by the light shielding unit 33 (light shielding member) can be measured using an optical sensor 89 mounted on the substrate stage 81. The optical sensor 89 can also be used to measure the irradiation region by the second light source unit 4. The optical sensor 89 may be, for example, an integrated light amount sensor that measures the light having passed through a pinhole, or an image sensor such as a CCD or CMOS sensor.

Figure 8:
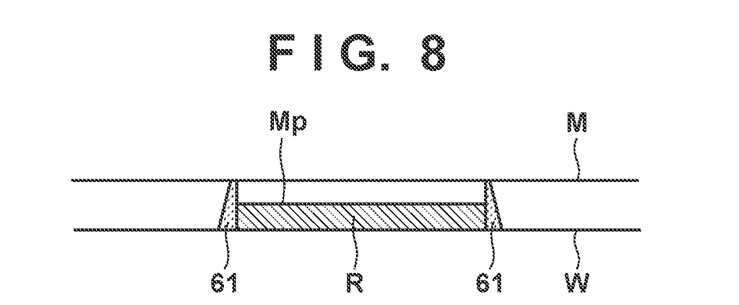
FIG. 8 is a view schematically showing extrusion of the uncured imprint material.

Here, the irradiation region by the first light source unit 1 defined by the light shielding unit 33 (light shielding member) will be described in more detail. In the imprint apparatus 100, the uncured imprint material R is arranged on the substrate W, and the mold M is pressed against the imprint material R to fill the imprint material R into the pattern in the pattern region Mp of the mold M. During the filling, a portion (to be referred to as an extruded portion hereinafter) 61 where the uncured imprint material R extrudes to the outside of the pattern region Mp can be formed as shown in FIG. 8. If the extruded portion 61 of the imprint material R is exposed, an unnecessary cured product is formed outside the pattern region Mp. The cured product in the extruded portion 61 may contact the mold M upon forming a pattern in an adjacent shot region. In addition, the cured product in the extruded portion 61 may hinder a proper etching process upon performing the etching process in the post-process. Hence, it is required in the imprint apparatus 100 to prevent the uncured imprint material R from extruding to the outside of the pattern region Mp.

Figure 3A:
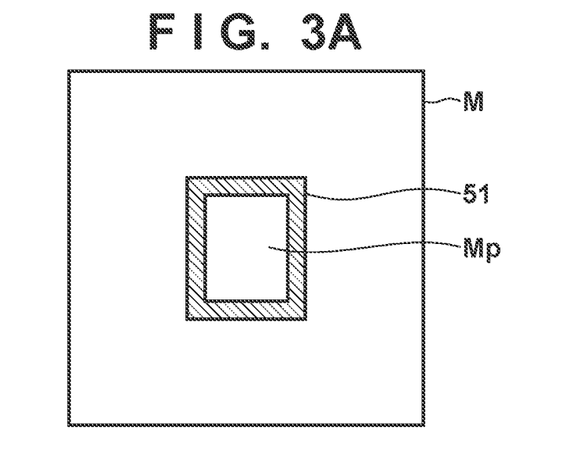
FIGS. 3A and 3B are views illustrating a light shielding film provided on a mold.
Figure 3B:
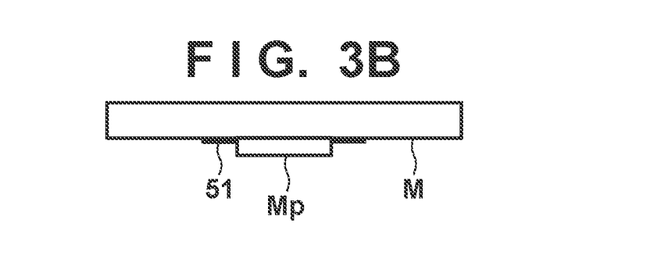

In order to prevent curing of the extruded portion 61, as illustrated in FIGS. 3A and 3B, a light shielding film 51 that shields exposure light can be arranged outside the pattern region Mp of the mold M. The light shielding film 51 is made of a material that does not transmit the exposure light, or a material that attenuates the exposure light by 50% or more. The light shielding film 51 may be, for example, a Cr film. The exposure light can be shielded by providing the Cr light shielding film 51 outside the pattern region Mp of the mold M. However, the IP (Image Placement) accuracy of the pattern region Mp can be decreased due to the film stress generated by the light shielding film 51. Therefore, in order to prevent a decrease in IP, the light shielding film 51 can be formed only in the minimum required region. In an example, the length of the Cr light shielding film 51 in the X-axis direction shown in FIG. 4 can be about 100 μm, but this dimension can be appropriately changed as needed.

Figure 4:
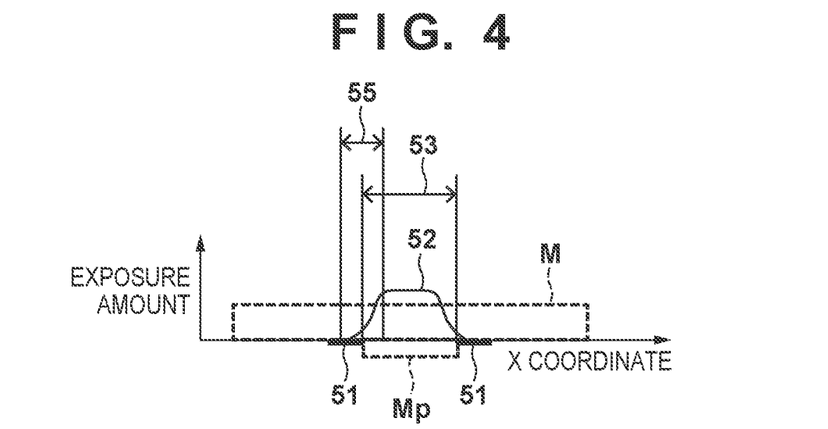
FIG. 4 is a view illustrating the exposure amount distribution of an imprint material on a substrate by first light from a first light source unit (first light source)

FIG. 4 illustrates an exposure amount distribution 52 of the imprint material R on the substrate W by the first light from the first light source unit 1 (first light source 91). The exposure amount distribution 52 may be understood as the light intensity distribution formed on the imprint material R by the first light from the first light source unit 1. The exposure amount distribution 52 (light intensity distribution) of the imprint material R on the substrate W by the first light from the first light source unit 1 has a shape reflecting the optical blurring in which the exposure amount (light intensity distribution) decreases toward the outside of the pattern region Mp. In this specification, a distance 55 of the portion where the exposure amount changes on the left side or right side of the exposure amount distribution 52 (or the light intensity distribution) is defined as the optical blurring amount.

In the imprint apparatus 100, the first light generated by the first light source unit 1 (first light source 91) is light for curing the imprint material R. Therefore, unlike a projection optical system used in a projection exposure apparatus, the optical design that suppresses aberrations is not required. Accordingly, even if the optical blurring amount is on the order of several nm, the performance of curing the imprint material R is not affected. However, as has been described above, if the imprint material R in the extruded portion extruding to the outside of the pattern region Mp is cured, a problem can occur. In order to prevent curing of the imprint material R in the extruded portion, for example, it is required to suppress the exposure amount in the extruded portion by the first light generated by the first light source unit 1. In order to prevent curing of the imprint material R in the extruded portion, for example, the exposure amount in the extruded portion should be 10% or less of the exposure amount required for curing. According to this, the position of the tail of the light intensity distribution of the first light from the first light source unit 1 can be adjusted such that the exposure amount at the position of the light shielding film 51 becomes 10% or less of the exposure amount required for curing. The light shielding unit 33 can be adjusted using a light amount sensor 141 so as to form the exposure light amount distribution 52 as described above.

Since the imprint material R in the extruded portion 61 shielded from light by the light shielding film 51 remains uncured after the imprint process is complete, the imprint material R can volatilize over time. In this manner, the problem caused by extrusion of the imprint material R is solved.

The alignment optical system 2 performs measurement for alignment between the mold M and the substrate W. The alignment optical system 2 is an optical apparatus for optically detecting the relative position between the mark 10 of the mold M and a mark 11 of the substrate W. The alignment optical system 2 can include a plurality of scopes 2a that can be driven. Each of the plurality of scopes 2a can be driven in the X-axis direction and the Y-axis direction in accordance with the position of the mark 10 of the mold M or the position of the mark 11 of the substrate W. The plurality of scopes 2a may also be configured to be drivable in the Z-axis direction to focus the position of the mark. In addition to the scopes 2a, the alignment optical system 2 can include a common optical system 21 and optical members 31, 22, and 23. The common optical system 21 and optical members 31, 22, and 23 can include, for example, optical members that form a relay optical system. The common optical system 21 and optical members 31, 22, and 23 can form, for example, an optical system that forms, at a position C, a plane conjugate to the surface of the substrate W.

A wide variety of substances are formed in a multilayer film on the substrate W, and the mark 11 of the substrate W can be formed in an arbitrary layer of the multilayer film. Therefore, if the wavelength band of the light used in the alignment optical system 2 is narrow and the wavelength band satisfies the interference condition of weakening the light intensity, a signal from the mark 11 of the substrate W becomes weak, making alignment difficult. To prevent this, the light used in the alignment optical system 2 desirably has a wavelength that does not photosensitize (cure) the imprint material R and covers a band as wide as possible. For example, it is desirable to cover a wavelength band of 400 to 2,000 nm, and it is more desirable to cover a wavelength band of at least 500 to 800 nm. For example, a lamp having a wide light emission wavelength band is preferable as the light source used in the alignment optical system 2. A wide band may be discretely covered by combining a plurality of light sources (light emitting diode, laser diode, or the like) including the light source having a light emission wavelength band of several ten nm and the light source having a light emission wavelength band of several nm. The control unit 140 can generate control information for controlling the substrate stage 81, the mold shape correction mechanism 34, the second light source unit 4, and the like based on the relative position and shape difference between the mold M and the substrate W acquired using the alignment optical system 2.

The observation optical system 3 can be a scope that can observe the entire region of at least one shot region S of the substrate W. The observation optical system 3 can be used to check the state of the imprint process. This can include, for example, the pressing state of the mold M with respect to the imprint material R on the substrate W, the filling state of the imprint material R into the pattern of the mold M, the separation state of the mold M from the cured product of the imprint material R on the substrate W, a foreign substance sandwiched between the mold M and the substrate W, and the like. The light of the observation optical system 3 is not required to have a band as wide as that of the alignment optical system 2, and only required to have a wavelength that does not photosensitize (cure) the imprint material R. In order to suppress expansion of the mold M or the substrate W due to the heat associated with the observation light and generation of a positional displacement and distortion of the pattern transferred to the imprint material R, the light intensity of the observation light is desirably weak within an observable range.

Figure 2:
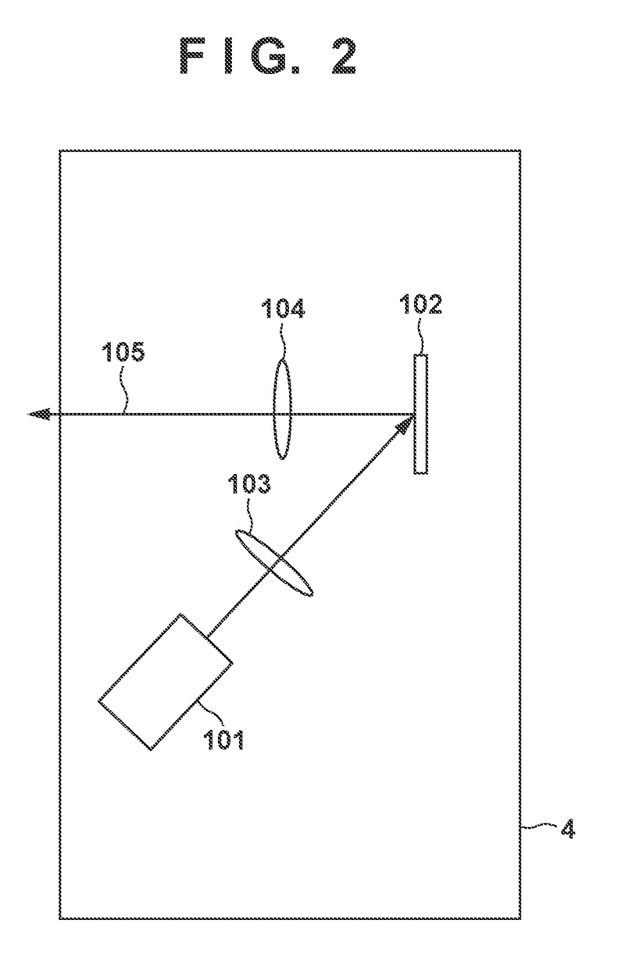
FIG. 2 is a view schematically showing the arrangement of a second light source unit.

FIG. 2 shows an arrangement example of the second light source unit 4. The second light source unit 4 can employ light having a wavelength different from that of the first light source unit 1. Further, the second light source unit 4 can generate light having a peak intensity only at one wavelength. From another point of view, the wavelength band of the second light generated by the second light source unit 4 is preferably narrower than the wavelength band of the first light generated by the first light source unit 1. The second light source unit 4 can employ, for example, light having a wavelength of 405 nm. The second light source unit 4 includes, as a second light source 101, a light source formed by a solid-state light emitting element (or a semiconductor light emitting element) such as a laser diode or a photodiode. In the exposure amount distribution 52 of the first light source unit 1 described with reference to FIG. 4, the exposure amount in the peripheral region in the pattern region Mp is smaller than that in the central region in the pattern region Mp. The insufficient exposure amount in the peripheral region can be compensated by the second light source unit 4.

Figure 10:
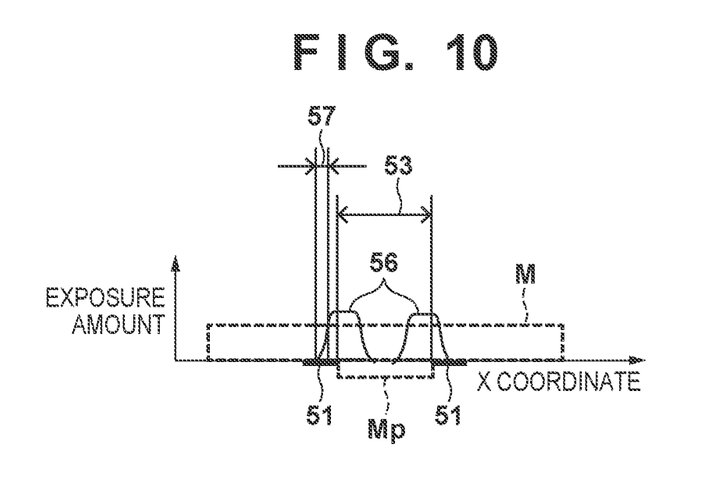
FIG. 10 is a view illustrating the exposure amount distribution of an imprint material on a substrate by second light from a second light source unit (second light source)

The second light source unit 4 can include an adjuster 102 to form a target exposure amount distribution or light intensity distribution. For example, the second light source unit 4 can apply the second light to the peripheral region in the pattern region Mp. FIG. 10 illustrates an exposure amount distribution 56 of the imprint material R by the second light applied to the imprint material R on the substrate W by the second light source unit 4. The exposure amount distribution 56 may be understood as the light intensity distribution formed on the imprint material R by the second light from the second light source unit 4. In order to compensate for the insufficient exposure amount in the peripheral region in the pattern region Mp, an optical blurring amount 57 of the second light source unit 4 can be set to fall within the width of the light shielding film 51. When the width of the light shielding film 51 is 100 μm, the optical blurring amount of the second light source unit 4 can be less than 100 μm. The arrangement as described above is advantageous for exposing the imprint material R in the shot region S with a uniform exposure amount.

In the peripheral region in the shot region S, the exposure amount of the imprint material R by the first light from the first light source unit 1 and the second light from the second light source unit 4 may be larger than that in the central region (the region that is located inside the peripheral region) in the shot region S.

The optical blurring amount in the peripheral region of the second light intensity distribution formed on the imprint material R by the second light from the second light source unit 4 is smaller than the optical blurring amount in the peripheral region of the first light intensity distribution formed on the imprint material R by the first light from the first light source unit 1. This can be implemented by using a laser diode as the second light source 101 of the second light source unit 4. Since the laser diode generates light of a single wavelength, it is easy to suppress the aberration (that is, it is easy to suppress the optical blurring amount) by optical design. Further, the laser diode is advantageous for obtaining a high illuminance.

In order to make the optical blurring amount by the second light source unit 4 smaller than the optical blurring amount by the first light source unit 1, the NA (numerical aperture) of the second light applied to the imprint material R is preferably smaller than the NA of the first light applied to the imprint material R. In an example, the NA of light reaching the imprint material R (substrate W) from the first light source unit 1 is 0.18, and the NA of light reaching the imprint material R (substrate W) from the second light source unit 4 is 0.05.

The imprint material R on the shot region S can be cured using only the second light source unit 4 out of the first light source unit 1 and the second light source unit 4. However, in a typical configuration, the illuminance on the imprint material R by the second light from the laser diode of the second light source unit 4 is smaller than the illuminance on the imprint material R by the first light from the high-pressure mercury lamp of the first light source unit 1. One of the reasons for this is that the second light from the laser diode of the second light source unit 4 is attenuated due to the transmittance and reflectance of the dichroic mirrors as the optical member 31 and an optical member 32 to be described later, and the half mirror as the optical member 36. Further, since the UV resistance of the adjuster 102 as the component of the second light source unit 4 has an upper limit, it is difficult to simply increase the light output of the second light source unit 4. From these reasons, it is difficult to cure the imprint material R only by the second light source unit 4 without a decrease in throughput.

Next, the arrangement of the second light source unit 4 will be described. Light 105 emitted from the second light source 101 such as a laser diode undergoes adjustment of the illumination region by an optical element 103, and illuminates the adjuster 102. The adjuster 102 reflects the light 105 having undergone spatial modulation in accordance with the set illumination pattern. Of the light 105 having entered the adjuster 102, unnecessary light in spatial modulation is applied to a light attenuator (diffuser) (not shown), so it does not reach the substrate W. The light 105 having undergone the spatial modulation undergone adjustment of the illumination magnification by an optical element 104, and illuminates the substrate W as the second light. As has been described above, the optical blurring amount of the second light applied to the imprint material R (substrate W) by the second light source unit 4 is smaller than that by the first light source unit 1. The optical blurring amount of the second light applied to the imprint material R (substrate W) by the second light source unit 4 is made smaller than the width of the light shielding film 51.

The adjuster 102 is controlled by the control unit 140 such that the shot region S is exposed with a target exposure amount (illuminance×time or √(illuminance)×time) distribution. The adjuster 102 can be, for example, a liquid crystal apparatus in which a plurality of liquid crystal elements are arranged in a light transmitting surface, and which can change the illuminance distribution and irradiation time by individually controlling the voltage applied to each of the plurality of liquid crystal elements. Alternatively, the adjuster 102 can be a digital mirror device (digital micromirror device) in which a plurality of mirror elements are arranged in an array in a light reflecting surface, and which can change the illuminance distribution and irradiation time by individually controlling the surface direction of each mirror element. Alternatively, the adjuster 102 may be a galvanometer mirror or a diffraction element such as a CGH, or may be another element. The temperature of the adjuster 102 can increase due to heat generated by an electric circuit of the adjuster 102, in addition to heat generated by partially absorbing the light 105 such as ultraviolet light. In order to ensure the performance and life of the adjuster 102, a cooling function by air cooling or water cooling can be provided.

The control unit 140 can be configured to control a plurality of components of the imprint apparatus 100, for example, the mold driving mechanism 6, the substrate driving mechanism 80, the first light source unit 1, the second light source unit 4, the alignment optical system 2, the optical observation system 3, and the dispenser 7. The control unit 140 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. The control unit 140 may be formed integrally with the remaining portions of the imprint apparatus 100 (in a common housing), or may be formed separately from the remaining portions of the imprint apparatus 100 (in another housing).

In the imprint apparatus 100 illustrated in FIG. 1, the alignment optical system 2 includes the common optical system 21, and the common optical system 21 is also shared by the first light source unit 1, the observation optical system 3, and the second light source unit 4. In an aspect, the common optical system 21 is an optical system that forms the first light intensity distribution on the imprint material R by the first light from the first light source unit 1, and forms the second light intensity distribution on the imprint material R by the second light from the second light source unit 4. The optical member 31 reflects the alignment light, and transmits the first light from the first light source unit 1, the observation light from the observation optical system 3, and the second light from the second light source unit 4. The common optical system 21 and the optical member 31 can be made of a material (for example, quartz or fluorite) having a transmittance high enough with respect to the first light from the first light source unit 1 and the second light from the second light source unit 4.

The optical member 31 is, for example, a dichroic mirror, and has, for example, a characteristic in which a reflectance in a wavelength band of 500 to 2,000 nm is high and a transmittance in a wavelength band of 200 to 500 nm is high. The wavelength band in which the reflectance is high is not limited to a wavelength band of 500 to 2,000 nm, and is desirably wider but may be, for example, a wavelength band of 600 to 900 nm or 500 to 800 nm due to constraints on manufacturing. Similarly, the wavelength band in which the transmittance is high is not limited to a wavelength band of 200 to 500 nm, and is desirably wider but may be, for example, a wavelength band of 300 to 600 nm or 300 to 500 nm.

The optical member 32 reflects the first light from the first light source unit 1, and transmits the light from the observation optical system 3 and the second light from the second light source unit 4. In an example, the wavelength band of the first light from the first light source unit 1 can be 400 nm or less, and the wavelength band of the second light from the second light source unit 4 can be 400 nm (inclusive) to 500 nm (inclusive). The optical member 32 can be, for example, a dichroic mirror. For example, the optical member 32 can have a characteristic in which a reflectance in a wavelength band of 400 nm or less (200 to 400 nm or 300 to 400 nm) is high and a transmittance in a wavelength band of 400 nm or more (400 to 500 nm or 400 to 600 nm) is high. A wavelength threshold is not limited to 400 nm, and may be, for example, 380 nm or 420 nm.

An optical member 35 is, for example, a half mirror, and shares a part of the optical path of the observation optical system 3 with a part of the optical path of the second light source unit 4. When the wavelength of the light used by the observation optical system 3 is equal to, is similar to, or partially overlaps the wavelength of the second light used by the second light source unit 4, a dichroic mirror cannot be used. The transmittance of the optical path of the observation optical system 3 and the transmittance of the optical path of the second light source unit 4 are not necessarily assigned evenly, such as 50%:50%. As has been described above, the observation optical system 3 only needs to be able to monitor the fillability of the imprint material into the pattern of the mold M. Therefore, for example, the transmittance of the optical path of the observation optical system 3 may be 40%, and the reflectance of the optical path of the second light source unit 4 may be 60%.

The dispenser 7 applies or arranges the imprint material R on the substrate W. The dispenser 7 need not be the component of the imprint apparatus 100, and may be provided as an external apparatus. When the dispenser 7 is provided as an external apparatus, the substrate W with the imprint material R arranged thereon by the dispenser 7 is provided to the imprint apparatus 100. According to the system configuration as described above, since it is unnecessary to arrange the imprint material R on the substrate W in the imprint apparatus 100, the faster process in the imprint apparatus 100 can be implemented. Further, since the dispenser 7 as the component of the imprint apparatus 100 is unnecessary, the manufacturing cost of the entire imprint apparatus 100 can be suppressed.

When the optical blurring amount of the first light source unit 1 is larger than the width of the light shielding film 51, as illustrated in the exposure amount distribution 52 in FIG. 4, the exposure amount changes between the central region in the pattern region Mp and the peripheral region in the pattern region Mp. Particularly, the exposure amount is insufficient in the peripheral region.

Figure 6:
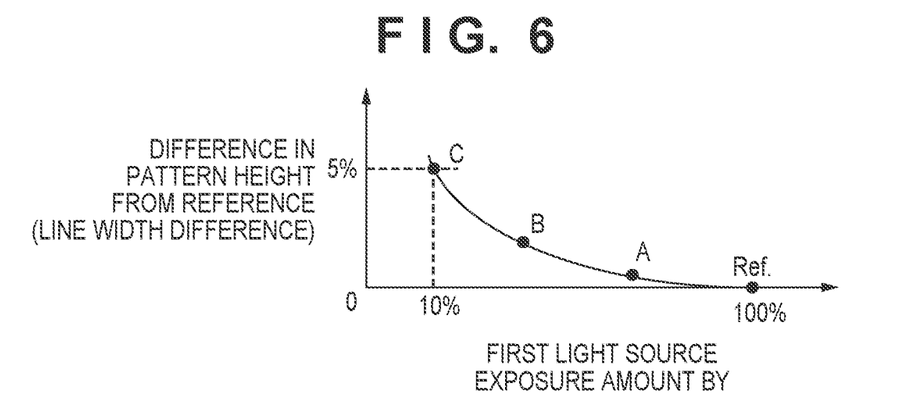
FIG. 6 is a graph illustrating the relationship between the exposure amount by the first light source unit and the pattern height change amount (line width change amount)

FIG. 6 shows the result of comparison between the pattern height (or line width) of the imprint material R cured with the target exposure amount and the pattern heights (or line widths) of the imprint material R cured with several kinds of exposure amounts smaller than the target exposure amount. The pattern height (or line width) of the imprint material R cured with the target exposure amount is used as a reference (Ref in FIG. 6). The ordinate of FIG. 6 represents the pattern height reduction rate (or line width reduction rate) relative to the reference caused by the difference in exposure amount. The abscissa represents the exposure amount by the first light source unit 1. It is experimentally confirmed that when the exposure amount by the first light source unit 1 becomes smaller than the reference, the pattern height (or line width) decreases. For example, at a point C in FIG. 6, when the exposure amount is 10% the reference, the pattern height is 5% smaller than the reference. It can be seen that when extrusion of the imprint material R to the outside of the pattern region Mp is suppressed by the light shielding film 51 and the light shielding unit 33, the uniformity of the pattern height cannot be maintained in the shot region S. If the uniformity of the pattern height deteriorates by about 5%, depending on the process, a problem may occur in which the etching process cannot be performed properly in the post-process, or the like.

It is technically possible to compensate for the insufficient exposure amount by extending the exposure time in accordance with the insufficient amount of exposure, but the throughput of the imprint apparatus 100 decreases in accordance with the extended exposure time. Further, since an extra heat amount is applied to the substrate W, the overlay accuracy can be degraded. In this embodiment, a technique is provided in which a change in pattern height or line width of the imprint material R caused by an insufficient exposure amount is suppressed while extrusion of the imprint material R is suppressed.

Figure 5:
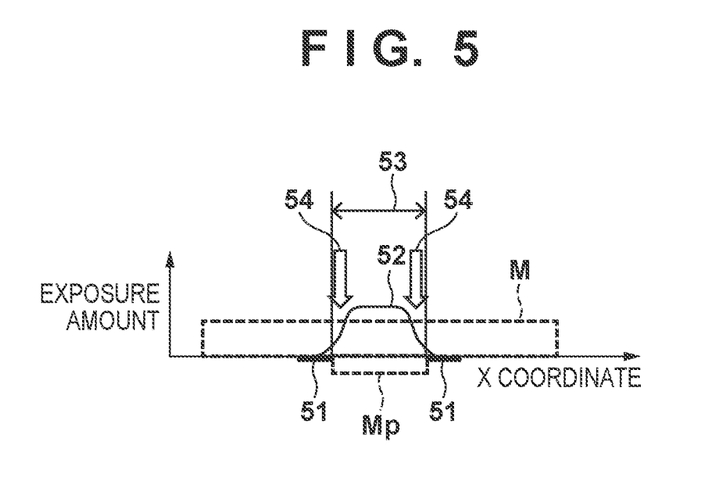
FIG. 5 is a view schematically showing exposure by the first light source unit and the second light source unit.

In order to ensure the uniformity of the pattern height or pattern line width after curing the imprint material R, in this embodiment, the exposure mount by the second light from the second light source unit 4 is added to the exposure amount by the first light from the first light source unit 1. More specifically, the exposure amount according to an exposure amount distribution 54 by the second light from the second light source unit 4 (FIG. 5) is added to the exposure amount according to the exposure amount distribution 52 by the first light from the first light source unit 1 (FIG. 4).

Here, a method of deciding the exposure amount distribution 54 by the second light will be described. As an example, the exposure amount by the first light from the first light source unit 1 is discretely decreased from 100% to 10%, and the pattern height (or line width) of the imprint material R cured with each exposure amount is stored in a database.

Then, the exposure amount by the second light source unit 4 to be added to the exposure amount by the first light source unit 1 is decided such that the pattern height (or line width) equal to the reference (in this example, the pattern height (or line width) at the exposure amount of 100% by the first light from the first light source unit 1) can be obtained at each exposure amount from 100% to 10% the exposure amount by the first light from the first light source unit 1. Since the wavelength of light changes between the first light source unit 1 and the second light source unit 4, the light absorption characteristic and curing reaction characteristic of the imprint material R changes between them. Therefore, a database corresponding to combinations of the wavelength of the first light source unit 1 and the wavelength of the second light source unit 4 can be prepared.

The control unit 140 uses the optical sensor 89 to acquire the exposure amount distribution 52 by the first light from the first light source unit 1 applied onto the substrate W, and generate the first exposure amount distribution by the first light source unit 1 in the shot region S.

Then, the control unit 140 decides the second exposure amount distribution of the second light source unit 4 by referring to the above-described database based on the first exposure amount distribution such that the change in pattern height (or a change in line width) falls within a target range (for example, within a range of ±1%). Based the second exposure amount distribution, the control unit 140 adjusts, using the adjuster 102, the exposure amount by the second light source unit 4 with respect to the substrate W. With the process described above, the uniformity of the pattern height (or line width) of the imprint material R can be improved without a decrease in throughput and without curing the imprint material R extruding to the outside of the pattern region Mp.

To summarize the above, in the imprint method according to this embodiment, the imprint material R is cured in a state in which the imprint material R on the substrate W and the mold M are in contact with each other. The imprint method includes a curing step of curing the imprint material R by applying the first light to the imprint material using the first light source and applying the second light to the imprint material using the second light source, thereby forming a plurality of patterns made of a cured product of the imprint material R. Here, the intensity distribution of the second light applied to the imprint material R by the second light source in the curing step is adjusted such that the distribution of evaluation values of the plurality of patterns formed through the curing step satisfies a target distribution. Here, the evaluation position is, for example, the pattern height or the pattern line width.

Figure 7:
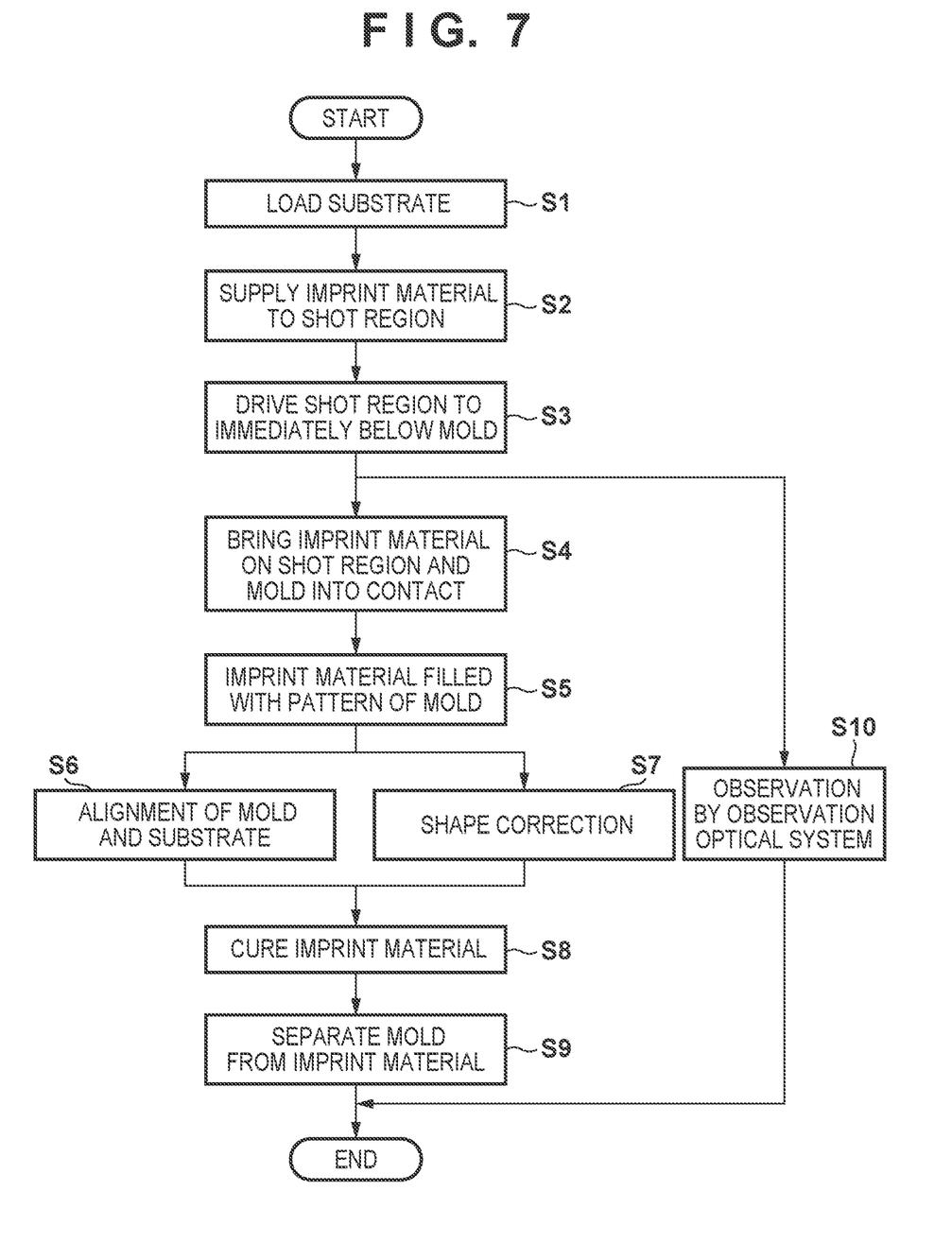
FIG. 7 is a flowchart illustrating the procedure of an imprint process.

An imprint process by the imprint apparatus 100 will be described blow with reference to FIG. 7. The process illustrated in FIG. 7 is controlled by the control unit 140. First, in step S1, the substrate (for example, wafer) W is conveyed to the substrate stage 81 by a substrate conveyance unit (not shown), and held by the chuck of the substrate stage 81. In step S2, the substrate stage 81 is driven to move the shot region S of the substrate W to an application position by the dispenser 7, and the imprint material R is arranged or applied on the shot region S by the dispenser 7. In step S3, the substrate stage 81 is driven to locate the shot region S, on which the imprint material R has been arranged, immediately below the mold M. In step S4, the mold driving mechanism 6 and/or the substrate driving mechanism 80 is controlled so as to bring the imprint material R on the shot region S and the mold M into contact with each other.

In step S5, the imprint material R is filled into the pattern (concave portion) of the pattern region Mp while the imprint material R flows along the pattern region Mp of the mold M. This is called a filling step. Step S6 and step S7 can be performed after the filling step in step S5 or in parallel with the filling step. In steps S6 and S7, the relative position between the mark 10 of the substrate W and the mark 11 of the mold M is detected using the alignment optical system 2 and, based on the result, alignment between the shot region of the substrate W and the pattern region of the mold M and shape correction of the mold M are performed. Alignment can be performed by, for example, the substrate driving mechanism 80, but may be performed by both the substrate driving mechanism 80 and the mold driving mechanism 6. Shape correction of the mold M is performed by the mold shape correction mechanism 34. Instead of or in addition to shape correction of the mold M, the shape of the shot region of the substrate W may be corrected. Shape correction of the shot region can be performed by, for example, applying a heat distribution to the substrate W.

In step S8, a curing step is performed in which the imprint material R on the shot region is cured using the first light source unit 1 and the second light source unit 4. In step S9, the mold M is separated from the cured product of the imprint material R on the substrate W. In parallel with steps S4 to S9, the substrate W, the imprint material R, and the mold M may be observed using the optical observation system 3 in step S10.

In steps S5 to S8, the second light source unit 4 applies the second light to the peripheral region in the pattern region Mp so as to prevent the imprint material R from extruding to a region that is located outside the outer edge of the pattern region Mp. With this, the viscosity of the imprint material R is increased, or the imprint material R is cured. In this case, it may be understood that the curing step starts when the second light is applied to the imprint material R by the second light source unit 4.

Figure 11:
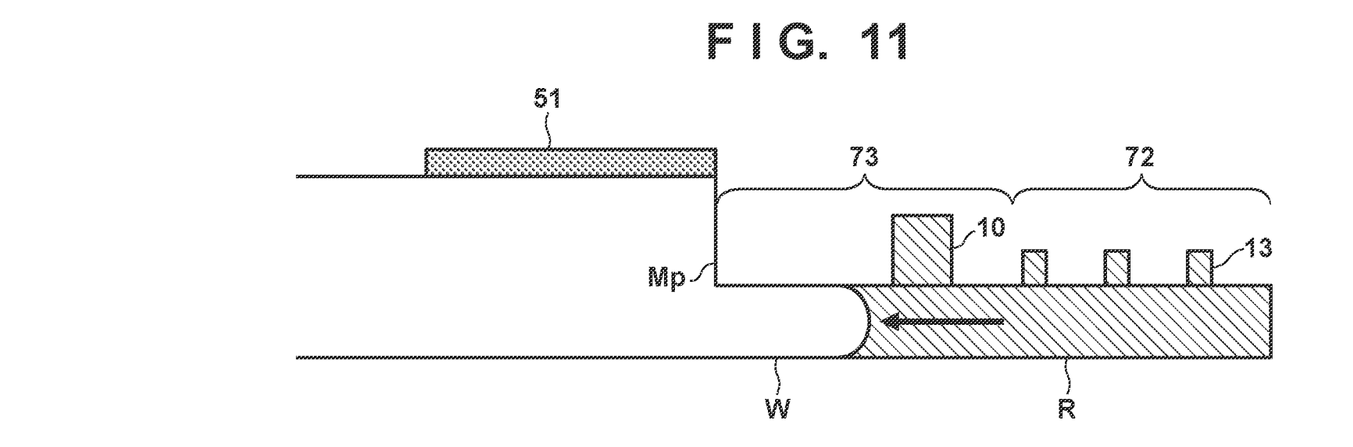
FIG. 11 is a view schematically showing the imprint material flowing below a peripheral region in a pattern region.

FIG. 11 schematically shows the imprint material R flowing below the peripheral region in the pattern region Mp. The pattern region Mp can include a device pattern region 72 and a peripheral region 73 that is located outside the device pattern region 72. The device pattern region 72 includes a plurality of device patterns 13, and the peripheral region 73 includes at least one mark 10.

If the second light from the second light source unit 4 is applied to the imprint material R through the region including the mark 10 while the imprint material R is filled into the mark 10 (concave portion), filling of the imprint material R into the mark 10 can be hindered. This can increase the filling time or cause poor filling. To avoid these problems, the timing of exposing the imprint material R through the peripheral region 73 (the region including the mark 10) in the pattern region Mp by the second light source unit 4 is preferably set after completion of filling of the imprint material R into the mark 10. From another point of view, the timing of exposing the imprint material R through the peripheral region 73 (the region including the mark 10) in the pattern region Mp by the second light source unit 4 is preferably set after the imprint material R passes below the mark 10. Since alignment between the substrate W (shot region S) and the mold M is performed in step S6 after this, exposure by the first light source unit 1 is not performed yet. The viscosity of a part of the imprint material R is increased or a part of the imprint material R is cured by exposure by the second light source unit 4. However, since it is a very small part of the shot region S, the influence on alignment in step S6 is minor.

Figure 12:
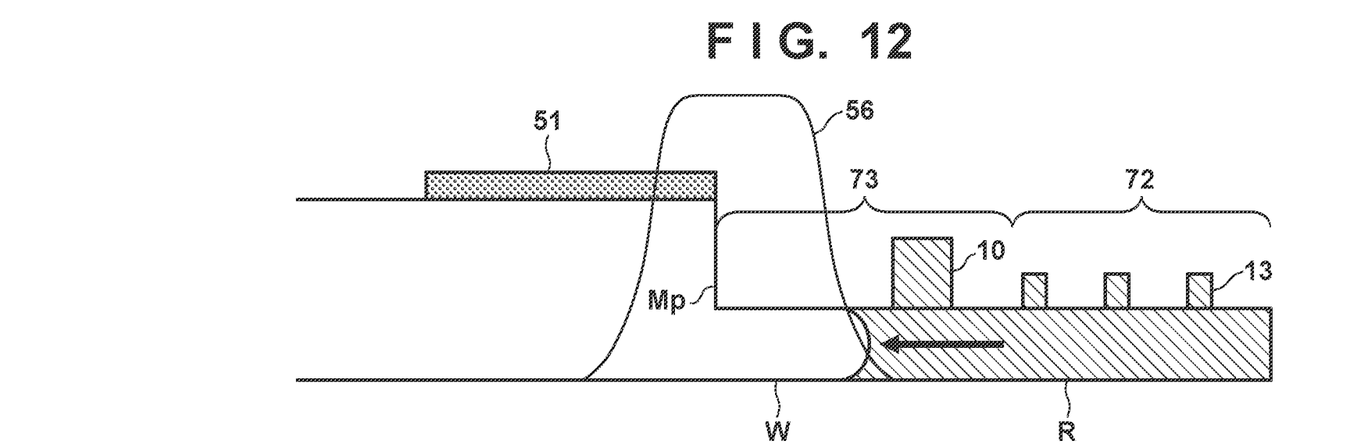
FIG. 12 is a view schematically showing the imprint material flowing below the peripheral region in the pattern region.

In addition, as shown in FIG. 12, no pattern generally exists in a region between the mark 10 and the outer edge of the pattern region Mp. In this case, it is unnecessary to consider the filling behavior of the imprint material R in the region between the mark 10 and the outer edge of the pattern region Mp. Accordingly, the exposure amount distribution 56 by the second light from the second light source unit 4 may be arranged outside the mark 10 as shown in FIG. 12. In this case, in the curing step, the second light from the second light source unit 4 is applied to the imprint material R only through a region in the pattern region Mp that is located outside the mark 10. Therefore, exposure by the second light source unit 4 can be started before completion of filling of the imprint material R into the mark 10 or the timing of the imprint material R passing below the mark 10. When the imprint material R flows into the exposure amount distribution 56 by the second light from the second light source unit 4, the viscosity of the imprint material R increases or the imprint material R is cured. Thus, the imprint material R can be prevented from extruding to the outside of the pattern region Mp.

In the curing step, applying the first light to the imprint material R by the first light source unit 1 may be started prior to applying the second light to the imprint material by the second light source unit 4. Such control is advantageous when filling of the imprint material R in the region irradiated with the first light is completed prior to filling of the imprint material R in the region irradiated with the second light.

In the curing step, a period in which the first light is applied to the imprint material R may at least partially overlap a period in which the second light is applied to the imprint material R.

According to the imprint process described above, the uniformity of the plurality of patterns formed on the substrate W can be improved.

Figure 9:
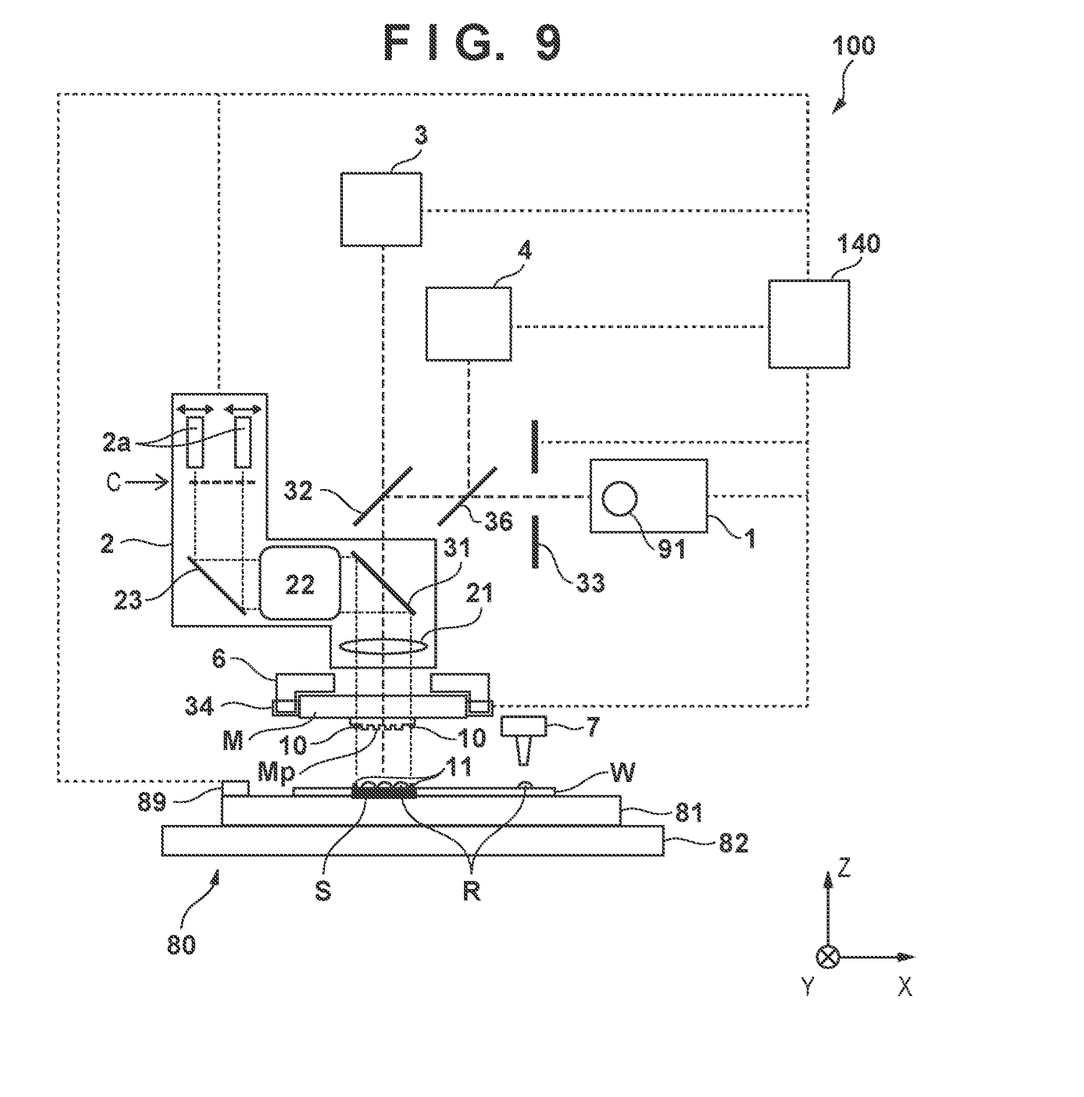
FIG. 9 is a view schematically showing the arrangement of an imprint apparatus according to the second embodiment.

FIG. 9 schematically shows the arrangement of an imprint apparatus 100 according to the second embodiment. Matters not mentioned as the second embodiment can follow the first embodiment. In the second embodiment, an optical member 36 (half mirror) that combines the first light from a first light source unit 1 and the second light from a second light source unit 4 is arranged between the first light source unit 1 and an optical member 32. In the second embodiment, the wavelength of the first light from the first light source unit 1 may be equal to the wavelength of the second light from the second light source unit 4. In the second embodiment, the member 35 in the first embodiment is unnecessary. Also in the second embodiment, the optical blurring amount of the second light source unit 4 is preferably smaller than the optical blurring amount of the first light source unit 1, and equal to or smaller than the width of a light shielding film 51.

When the wavelength of light of the first light source unit 1 is equal to that of the second light source unit 4, the procedure of deciding the exposure amount of the second light source unit 4 described in the first embodiment can be simplified. Since the wavelengths are equal to each other, it is unnecessary to consider the differences in light absorption characteristic and curing reaction characteristic of the imprint material R according to the difference in wavelength. Accordingly, the exposure amount distribution by the second light source unit 4 may be decided so as to compensate for the exposure amount distribution 52 by the first light source unit 1 to achieve the necessary exposure amount for curing the imprint material R. That is, the database linking the exposure amount and the change in pattern height (the change in line width), that is used when light beams having different wavelengths are combined, is unnecessary.

The pattern of a cured product formed using the imprint apparatus is used permanently for at least some of various kinds of articles or temporarily when manufacturing various kinds of articles. The article is an electric circuit element, an optical element, a MEMS, a recording element, a sensor, a mold, or the like. Examples of the electric circuit element are volatile or nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 13A:
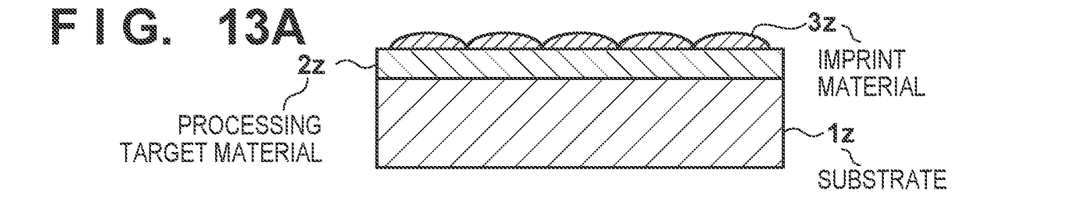
FIGS. 13A to 13F are views for explaining an article manufacturing method.

A method of manufacturing an article in which the imprint apparatus forms a pattern on a substrate, processes the substrate on which the pattern is formed, and manufactures an article from the processed substrate will be described next. As shown FIG. 13A, a substrate 1*z* such as a silicon wafer with a processed material 2*z* such as an insulator formed on the surface is prepared. Next, an imprint material 3*z* is applied to the surface of the processed material 2*z* by an inkjet method or the like. A state in which the imprint material 3*z* is applied as a plurality of droplets onto the substrate is shown here.

Figure 13B:
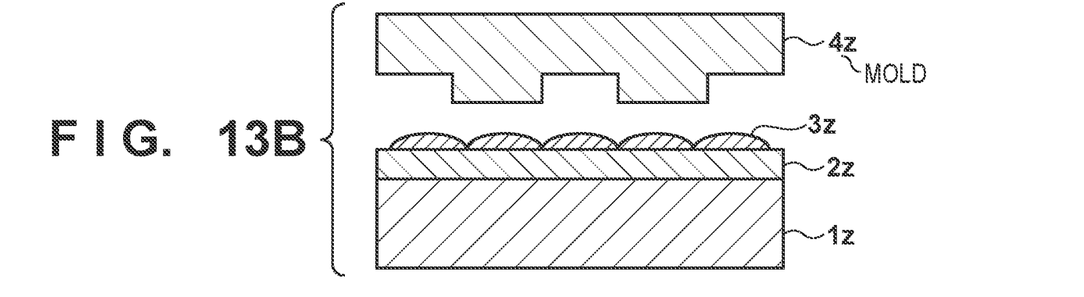
Figure 13C:
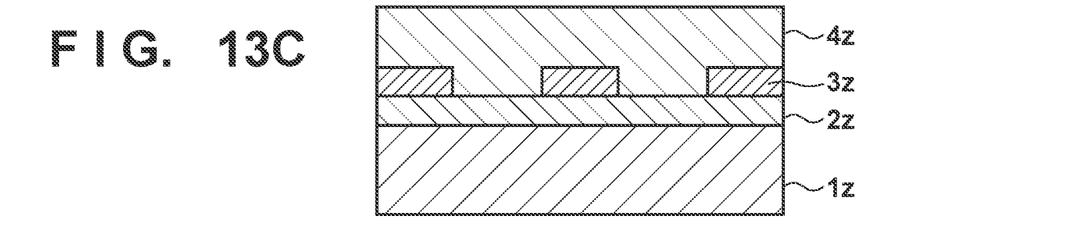

As shown in FIG. 13B, a side of a mold 4*z* for imprint with a concave-convex pattern is directed toward and made to face the imprint material 3*z* on the substrate. As shown FIG. 13C, the substrate 1*z* to which the imprint material 3*z* is applied is brought into contact with the mold 4*z*, and a pressure is applied. The gap between the mold 4*z* and the processed material 2*z* is filled with the imprint material 3*z*. In this state, when the imprint material 3*z* is irradiated with light as energy for curing via the mold 4*z*, the imprint material 3*z* is cured.

Figure 13D:
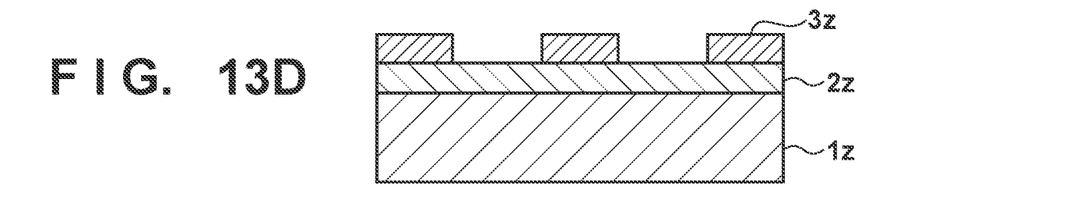

As shown in FIG. 13D, after the imprint material 3*z* is cured, the mold 4*z* is separated from the substrate 1*z*, and the pattern of the cured product of the imprint material 3*z* is formed on the substrate 1*z*. In the pattern of the cured product, the concave portion of the mold corresponds to the convex portion of the cured product, and the convex portion of the mold corresponds to the concave portion of the cured product. That is, the concave-convex pattern of the mold 4*z* is transferred to the imprint material 3*z*.

Figure 13E:
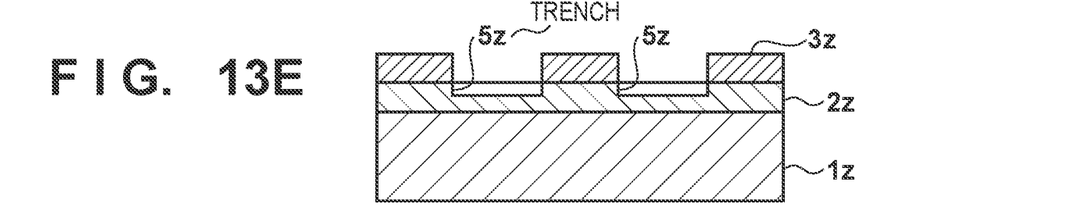
Figure 13F:
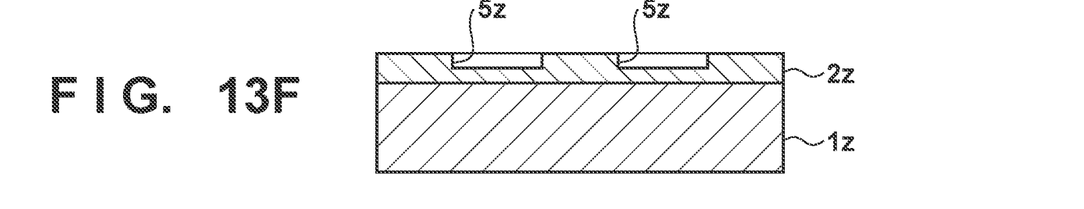

As shown in FIG. 13E, when etching is performed using the pattern of the cured product as an etching resistant mask, a portion of the surface of the processed material 2*z* where the cured product does not exist or remains thin is removed to form a groove 5*z*. As shown in FIG. 13F, when the pattern of the cured product is removed, an article with the grooves 5*z* formed in the surface of the processed material 2*z* can be obtained. Here, the pattern of the cured product is removed. However, instead of removing the pattern of the cured product after the process, it may be used as, for example, an interlayer dielectric film included in a semiconductor element or the like, that is, a constituent member of an article.

An article manufacturing method according to another embodiment will be described below. A method of manufacturing a device (a semiconductor integrated circuit element, a liquid crystal display element, or the like) as an article includes a step of forming a pattern on a substrate (a wafer, a glass plate, or a film-shaped substrate) using the above-described imprint apparatus. The article manufacturing method can also include a step of processing the substrate with the pattern formed there on, for example, an etching process. Note that when manufacturing another article such as a patterned medium (recording medium) or an optical element, the manufacturing method can include another process of processing the substrate with the pattern being formed in place of etching. The article manufacturing method according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-206268, filed Dec. 20, 2021, which is hereby incorporated by reference herein in its entirety.

What is claimed is:

1. An imprint method of curing an imprint material on a shot region of a substrate in a state in which the imprint material on the substrate and a mold are in contact with each other, the method comprising:
generating a first exposure amount distribution of a first light to be applied to the imprint material using a first light source, wherein the first exposure amount distribution decreases from a central portion of the shot region to a peripheral portion of the shot region;
generating a second exposure amount distribution of a second light to be applied to the imprint material using a second light source based on the first exposure amount distribution; and
curing the imprint material by applying the first light to the imprint material using the first light source and applying the second light to the imprint material using the second light source, thereby forming a plurality of patterns made of a cured product of the imprint material,
wherein the second exposure amount distribution of the second light applied to the imprint material by the second light source in the curing is adjusted such that a distribution of evaluation values of the plurality of patterns formed through the curing satisfies a target distribution.

2. The method according to claim 1, wherein
the mold includes a pattern region corresponding to the shot region of the substrate, and
in the curing, the first light is applied to the imprint material through the pattern region, and the second light is applied to a peripheral region in the pattern region.

3. The method according to claim 2, wherein an exposure amount of the imprint material by the first light and the second light in the peripheral region is larger than in a central region that is located inside the peripheral region.

4. The method according to claim 2, wherein in the curing, applying the second light to the imprint material is started prior to applying the first light to the imprint material.

5. The method according to claim 2, wherein
the pattern region includes a device pattern region and a peripheral region that is located outside the device pattern region, and the peripheral region includes a mark,
the second light is applied to the imprint material through a region including the mark, and
in the curing, the second light is applied to the imprint material through the region including the mark after the imprint material is filled into the mark.

6. The method according to claim 2, wherein
the pattern region includes a device pattern region and a peripheral region that is located outside the device pattern region, and the peripheral region includes a mark, and
in the curing, the second light is applied to the imprint material only through a region in the pattern region that is located outside the mark.

7. The method according to claim 2, wherein in the curing, applying the first light to the imprint material is started prior to applying the second light to the imprint material.

8. The method according to claim 2, wherein in the curing, a period in which the first light is applied to the imprint material at least partially overlaps a period in which the second light is applied to the imprint material.

9. The method according to claim 2, wherein the first light is applied to the imprint material with a first optical blurring amount, and the second light is applied to the imprint material with a second optical blurring amount smaller than the first optical blurring amount.

10. The method according to claim 9, wherein the second optical blurring amount is not more than 100 μm.

11. The method according to claim 2, wherein the first light is light having peak intensities at at least two wavelengths, and the second light is light having a peak intensity only at one wavelength.

12. The method according to claim 2, wherein a wavelength band of the second light is narrower than a wavelength band of the first light.

13. The method according to claim 11, wherein the first light is generated by a high-pressure mercury lamp, and the second light is generated by a solid-state light emitting element.

14. The method according to claim 2, wherein an NA of the second light is smaller than an NA of the first light.

15. An article manufacturing method comprising:
forming a pattern on a substrate by an imprint method defined in claim 1; and
processing the substrate with the pattern formed thereon to obtain an article.

16. An imprint apparatus that cures an imprint material in a state in which the imprint material on a substrate and a mold are in contact with each other, the apparatus comprising:
a first light source unit configured to generate first light;
a second light source unit configured to generate second light; and
an optical system configured to form a first light intensity distribution on the imprint material by the first light from the first light source unit and form a second light intensity distribution on the imprint material by the second light from the second light source unit,
wherein the second light source unit includes an adjuster configured to adjust the second light intensity distribution, and an optical blurring amount in a peripheral region of the second light intensity distribution is smaller than an optical blurring amount in a peripheral region of the first light intensity distribution.

17. The apparatus according to claim 16, wherein the adjuster is configured to adjust the second light intensity distribution such that an insufficient exposure amount caused by optical blurring in the peripheral region of the first light intensity distribution is compensated by the second light intensity distribution.

18. The apparatus according to claim 16, wherein the optical blurring amount in the peripheral region of the second light intensity distribution is not more than 100 μm.

19. The apparatus according to claim 16, wherein the first light source unit is configured to generate light having peak intensities at at least two wavelengths, and the second light source unit generates light having a peak intensity only at one wavelength.

20. The apparatus according to claim 19, wherein the first light source unit includes a high-pressure mercury lamp, and the second light source unit includes a solid-state light emitting element.

21. The apparatus according to claim 16, wherein a wavelength band of the second light is narrower than a wavelength band of the first light.

22. The apparatus according to claim 16, wherein an NA of the second light is smaller than an NA of the first light.

* * * * *